United States Patent
Gao (10) Patent No.: US 11,032,949 B2
(45) Date of Patent: Jun. 8, 2021

(54) METHOD FOR DEPLOYING LIQUID COOLING SOLUTION IN AN AIR-COOLED DATA CENTER ROOM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 16/587,924

(22) Filed: Sep. 30, 2019

(65) Prior Publication Data
US 2021/0100134 A1    Apr. 1, 2021

(51) Int. Cl.
H05K 7/20 (2006.01)
H05K 7/14 (2006.01)

(52) U.S. Cl.
CPC ....... H05K 7/20636 (2013.01); H05K 7/1487 (2013.01); H05K 7/1489 (2013.01); H05K 7/20254 (2013.01); H05K 7/20272 (2013.01)

(58) Field of Classification Search
CPC .......... H05K 7/20636; H05K 7/20254; H05K 7/20272; H05K 7/1489; H05K 7/1487; H05K 7/20218; H05K 7/20509
USPC ................................................. 361/699, 702
See application file for complete search history.

(56) References Cited

U.S. PATENT DOCUMENTS

| | | | | |
|---|---|---|---|---|
| 7,088,585 B2* | 8/2006 | Chu | ..................... | H05K 7/2079 165/104.33 |
| 7,961,475 B2* | 6/2011 | Campbell | .......... | H05K 7/20772 361/748 |
| 8,274,790 B2* | 9/2012 | Campbell | .......... | H05K 7/20836 361/696 |
| 8,583,290 B2* | 11/2013 | Campbell | .......... | G05D 23/1934 700/282 |
| 8,711,563 B2* | 4/2014 | Campbell | ................. | F28F 9/00 361/696 |
| 10,225,957 B2* | 3/2019 | Gao | ................... | H05K 7/20172 |
| 10,238,011 B1* | 3/2019 | Cui | .................... | H05K 7/20781 |
| 10,334,763 B2* | 6/2019 | Gao | ................... | H05K 7/20818 |
| 10,485,143 B2* | 11/2019 | Gao | ................... | H05K 7/20772 |

(Continued)

*Primary Examiner* — Stephen S Sul
(74) *Attorney, Agent, or Firm* — Womble Bond Dickinson (US) LLP (57) ABSTRACT

An electronic rack includes an array of server shelves inserted into at least some of a plurality of standard slots of the electronic rack. Each server shelf contains one or more servers and each server includes one or more processors. At least some of the processors are mounted on cold plates for liquid cooling. The electronic rack further includes a liquid manifold shelf inserted into one of the standard slots. The liquid manifold shelf includes a pair of an upstream supply port and an upstream return port and further includes one or more pairs of a downstream inlet port and a downstream outlet port. The upstream supply port is coupled to a facility liquid supply line to receive cooling liquid from an external cooling liquid source and the upstream return port to return the cooling liquid back to the external cooling liquid source. At least some of the pairs of the downstream inlet port and downstream outlet port are coupled to the cold plates of some of the server shelves to circulate the cooling liquid to provide liquid cooling to the corresponding processors. A multifunction sectional pipes are assembled for connecting the fluid loops.

20 Claims, 8 Drawing Sheets

(56) References Cited

U.S. PATENT DOCUMENTS

| | | | |
|---|---|---|---|
| 2005/0225936 A1* | 10/2005 | Day | H05K 7/20754 |
| | | | 361/679.47 |
| 2006/0126296 A1* | 6/2006 | Campbell | H05K 7/20781 |
| | | | 361/700 |
| 2008/0093054 A1* | 4/2008 | Tilton | H05K 7/20681 |
| | | | 165/104.21 |
| 2012/0147553 A1* | 6/2012 | Eriksen | H05K 7/20272 |
| | | | 361/679.53 |
| 2014/0102672 A1* | 4/2014 | Campbell | H05K 7/20836 |
| | | | 165/104.33 |
| 2015/0109730 A1* | 4/2015 | Campbell | F28D 15/0266 |
| | | | 361/679.53 |
| 2015/0173251 A1* | 6/2015 | Campbell | H05K 7/20772 |
| | | | 361/699 |
| 2016/0113149 A1* | 4/2016 | Krug, Jr. | H05K 7/20781 |
| | | | 361/679.53 |
| 2016/0141937 A1* | 5/2016 | Campbell | F25B 15/00 |
| | | | 290/43 |
| 2016/0205810 A1* | 7/2016 | Marshall | H05K 7/20781 |
| | | | 165/11.2 |
| 2016/0242318 A1* | 8/2016 | Krug, Jr. | H05K 7/20772 |
| 2016/0242319 A1* | 8/2016 | Edwards | F04D 29/586 |
| 2017/0177041 A1* | 6/2017 | Shelnutt | G06F 1/20 |
| 2017/0181326 A1* | 6/2017 | Shelnutt | H05K 7/20772 |
| 2017/0196124 A1* | 7/2017 | Peng | H05K 7/20327 |
| 2020/0100392 A1* | 3/2020 | Iyengar | H05K 7/20509 |

* cited by examiner

METHOD FOR DEPLOYING LIQUID COOLING SOLUTION IN AN AIR-COOLED DATA CENTER ROOM

FIELD OF THE DISCLOSURE

Embodiments of the present invention relate generally to data centers. More particularly, embodiments of the invention relate to deploying liquid cooling in a data center room with existing an air-cooling system.

BACKGROUND

Liquid cooling solution is becoming an important technique for information technology (IT) equipment and computer rooms such as data centers, especially in the artificial intelligence (AI) and cloud era. In the AI era, many machine-learning workloads requires high performance and high density computes that use many high power density processors, such as a CPU (central processing unit) and a GPU (general-purpose processing unit). In addition, it becomes a more feasible solution in packaging industry to pack more and more such high power density processors closer to each other. With the power density constantly growing, the thermal management becomes a challenge, and liquid cooling is a feasible solution.

When the servers are equipped with liquid cooling solutions/devices, the data centers should be ready for supporting the liquid sources and the data center cooling infrastructure should be ready for deploying and operating this liquid cooled equipment. This becomes a challenge for many existing data centers that the cooling infrastructures have been deployed and operated, especially the ones which was initially designed to be only operating with air cooling solutions.

Air cooling is still the most common used cooling infrastructure for many colocation data centers and enterprise data centers, and the air cooling will be continue needed for a long period of time. Therefore, it may require colocation data centers be able to dynamically adjust or upgrade their infrastructure to be able to deploy liquid cooling solution. It also requires colocation data centers to only upgrade portion of the data center to be able to support operating liquid cooling IT equipment in the room. In cloud business and services, the data center needs to be able to flexible for different type of hardware and software requirement.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the invention provide a method for deploying liquid cooling solution in a traditional data center. It is highly standard solution which can be applied to many scenarios with proper customization. It provides a method for deploying liquid cooling solution in existing air cooled data centers. The design uses a liquid coolant distribution unit (CDU) to replace an existing air cooled equipment such as CRAH/CRAC (computer room air handler/computer room air conditioning) units or InRow coolers. Or the CDU can be directly deployed in a data center. After the CDU is located in the data center room, the CDU is connected to the existing chilled water loop directly.

A sectional manifold or piping method is used for connecting the CDU and the electronic racks in the room. A sectional manifold is basically consisted with connectors on the two end and a medium piping session. The piping session can be either a hard hose such as stainless steel ones or flexible hoses such as EPDM (ethylene propylene diene monomer) rubber ones. And then a rack mounting manifold which is populated on an electronic rack is connected to the piping. The liquid cooled equipment is then connected to the rack mounting manifold. In another design, if the rack mounted CDU is used, then the piping session are used for connecting facility water to the CDU. The rack mount CDU and the rack manifold are designed as one unit. The liquid cooled servers are connected to the CDU as well as the manifold. Multiple manifolds can be deployed on a single rack and connected with fluid loop to extend the fluid distribution across the rack.

According to one embodiment, an electronic rack includes an array of server shelves inserted into at least some of a plurality of standard slots of the electronic rack. Each server shelf contains one or more servers and each server includes one or more processors. At least some of the processors are mounted on cold plates for liquid cooling. The electronic rack further includes a liquid manifold shelf inserted into one of the standard slots. The liquid manifold shelf includes a pair of an upstream supply port and an upstream return port and further includes one or more pairs of a downstream inlet port and a downstream outlet port. The upstream supply port is coupled to a facility liquid supply line to receive cooling liquid from an external cooling liquid source and the upstream return port to return the cooling liquid back to the external cooling liquid source. At least some of the pairs of the downstream inlet port and downstream outlet port are coupled to the cold plates of some of the server shelves to circulate the cooling liquid to provide liquid cooling to the corresponding processors.

In one embodiment, the upstream supply port and the upstream return port are coupled to the external cooling liquid source via one or more sectional pipes that have been prefabricated. A sectional pipe may include a male and female dripless connector on its two ends for easy connection with another sectional pipe. A sectional pipe may further include a liquid pump integrated therein to help circulate the cooling liquid. Configurations of the sectional pipes may vary. For example, a sectional pipe in a variety of shapes, such as straight, angled, curved shapes. A sectional pipe may be configured in one-to-N split or N-to-one merged configuration.

In one embodiment, the upstream supply port and the upstream return port are coupled to a room CDU located within a data center room that houses a number of electronic racks. The electronic rack further includes a rack CDU. The upstream inlet port and the upstream outlet port of the liquid manifold shelf are coupled to the rack CDU to partially form a secondary loop. The rack CDU is further coupled to a facility liquid supply line and a facility liquid return line of the data center to partially form a primary loop. The rack CDU may be inserted into any of the standard slots of the electronic rack. In one embodiment, the rack CDU and the liquid manifold shelf are integrated as a single unit that can be inserted into any one or multiple of the standard shelves. In one embodiment, multiple manifolds can be integrated to the rack together with a rack CDU, either a in a combined version or a separated version. In one embodiment, the manifold or the fluid distribution functions can be integrated onto to an IT node and populated to the rack with the IT node at the same time.

Figure 1:
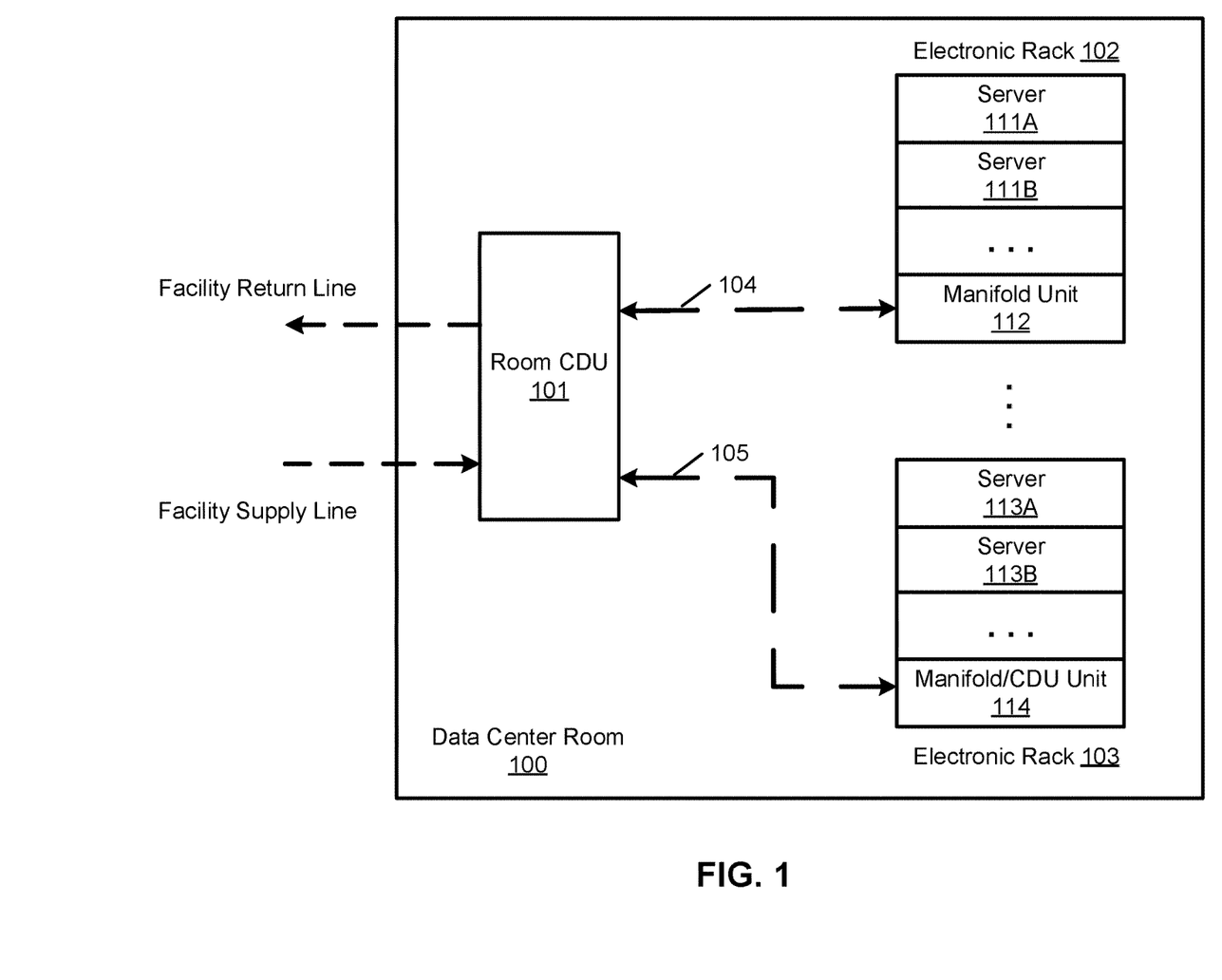
FIG. 1 shows an example of a data center system according to one embodiment.

FIG. 1 shows an example of a data center system according to one embodiment. Referring to FIG. 1, data center room 100 may be one of the many data center rooms of a data center. Each data center room house a number of electronic racks. As described above, a traditional data center room is air cooled using a CRAC unit. To provide liquid cooling to a traditional or existing air-cooled data center room, in one embodiment, the CRAC unit may be replaced with a CDU or additional CDU is added in the data center room in addition to the CRAC, where such a CDU is referred to as a room CDU. Embodiments of the disclosure are to provide liquid cooling to the electronic racks of an existing air-cooled data center system.

In one embodiment, data center room 100 includes a room CDU 101 coupled to a number of electronic racks 102-103. Although there are only two electronic racks shown, more electronic racks may be coupled to room CDU 101 within data center room 100. CDU 101 is a liquid-to-liquid heat exchanger. The primary loop of CDU 101 is coupled to the facility loop of the data center. The secondary loop of CDU 101 is coupled to the electronic racks that require liquid cooling. In one embodiment, room CDU 101 is coupled to electronic racks 102-103 using sectional pipes that have been prefabricated (referred to as a sectional room manifold 104-105 represented by dash lines herein). Sectional piping and manifold 104-105 are used for connecting the CDU 101 and the racks 102-103. These sectional piping and modules are prefabricated ones with different sizes, connectors, functions, designs and so on. An industry standardization design for these sectional piping and modules can be developed.

Each of electronic racks 102-103 includes a number of standard shelves arranged in a stack. A server shelf having one or more servers can be inserted into any of the standard shelves. For example, electronic rack 102 includes server shelves 111A-111C and electronic rack 103 includes server shelves 113A-113C. Each of the server shelves has the same or similar form factor that can be inserted into any of the standard shelves. Typically, electronic racks 102-103 are traditional electronic racks that are configured to be air cooled using a cooling fan. This means that such electronic racks are not equipped with proper liquid cooling equipment such as rack liquid manifold, etc., to be able to support operating of a liquid cooled equipment.

According to one embodiment, in order to support liquid cooling in a traditionally air cooled electronic rack, a rack manifold shelf is designed to provide liquid distribution to the server shelves that support liquid cooling such as equipped with cold plates and the associated liquid distribution channels. Since the conventional air-cooled electronic rack is not equipped with a rack manifold. A rack manifold shelf can be utilized, which can be inserted into any of the standard shelves. As a result, the main structure of the electronic rack does not need to be modified. Instead, a standard shelf can be utilized or converted into a rack manifold to distribute cooling liquid to other server shelves. The liquid connections between a rack manifold unit and a server shelf can be established using one or more sectional pipes. As a result, the servers that need liquid cooling can be easily coupled to the rack manifold shelf.

In this example, electronic rack 102 includes rack manifold shelf 112 and electronic rack 103 includes rack manifold 114. In one embodiment, rack manifold shelves 112 and 114 are configured to have the same or similar form factor as of a server shelf, such that they can be inserted into any of the standard shelves. Note that the sequential order or specific locations of the server shelves and/or rack manifold shelves are shown for illustration purpose only; other configurations may exist.

In one embodiment, each of rack manifold shelves 112 and 114 includes an upstream port (e.g., a pair of supply and return ports) to be coupled to room CDU 101 and one or more downstream ports to be coupled to the cold plates of the servers for liquid cooling. In one embodiment, rack manifold shelf or unit 114 may be configured as an integrated shelf having rack manifold unit and a rack CDU integrated therein. The primary loop of the rack manifold is coupled to room CDU 101 representing a room cooling loop and the secondary loop of rack CDU is coupled to the upstream ports of rack manifold unit. In the case rack CDU and rack manifold are one unit, such as manifold/CDU unit 114, the primary loop of rack CDU and manifold unit 114 is coupled to the facility liquid cooling node directly. Note that room CDU 101 is optional if a rack CDU is mounted. For example, in FIG. 1. If only rack manifold unit 122 is used on the rack 102, then CDU 101 is needed. If rack manifold and CDU unit are combined on the rack, CDU 101 is an optional one. The supply and return lines 104-105 can be directly coupled to the facility supply and return lines. Also note that the liquid connections between the rack manifold shelf and the server shelves may also be configured using prefabricated sectional pipes, as shown in FIG. 2.

Figure 2:
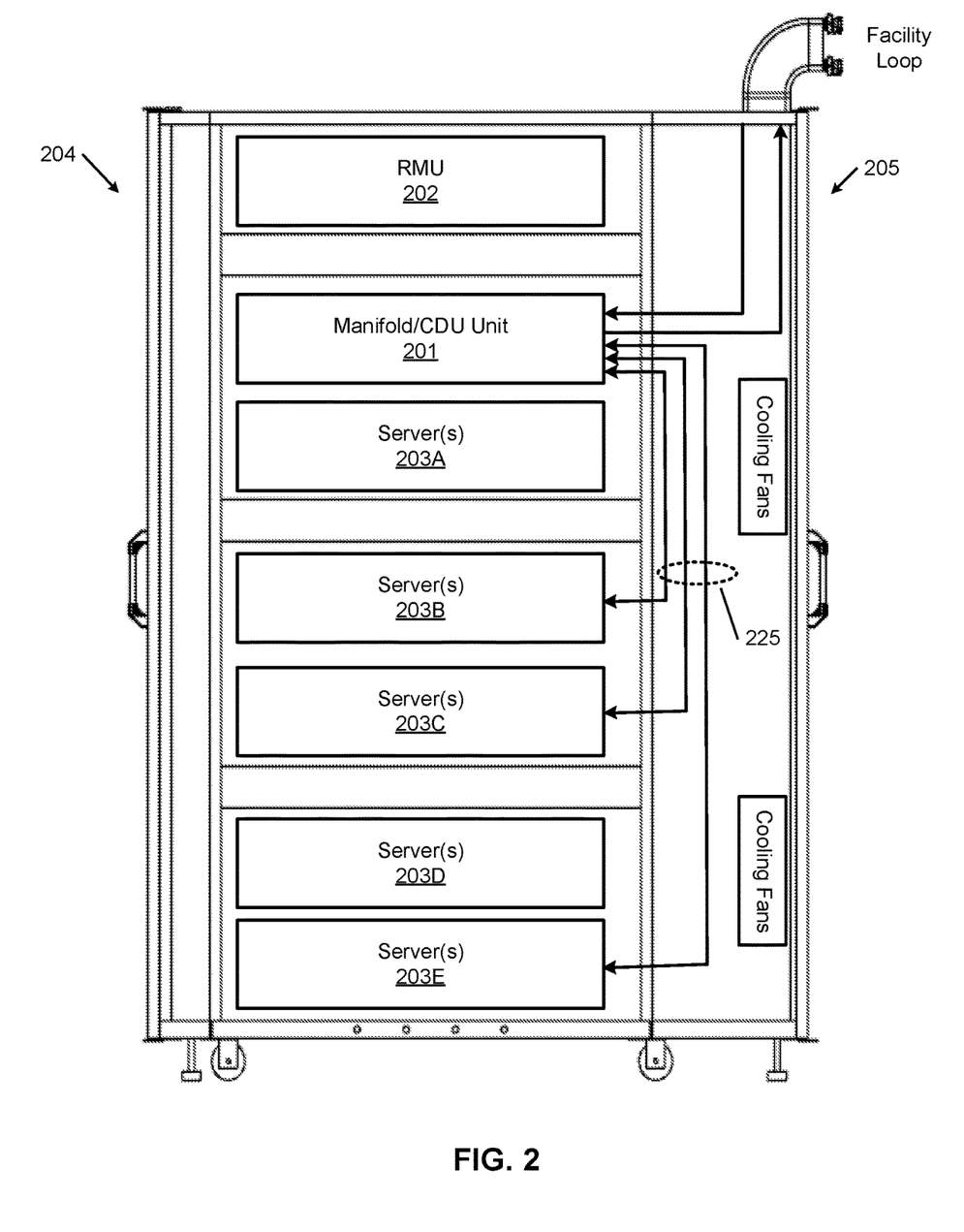
FIG. 2 shows an electronic rack according to one embodiment.

FIG. 2 is a block diagram illustrating an electronic rack according to one embodiment of the invention. Electronic rack 200 may represent electronic rack 102 of FIG. 1. Referring to FIG. 2, in one embodiment, electronic rack 200 includes rack manifold and/or CDU 201, RMU 202, and one or more server blades 203A-203E (collectively referred to as server blades 203). Server blades 203 can be inserted into an array of standard slots respectively from frontend 204 of electronic rack 200. Note that although there are only five server blades 203A-203E shown in FIG. 2, more or fewer server blades may be maintained within electronic rack 200. Also note that the particular positions of CDU 201, CMU 202, and server blades 203 are shown for the purpose of illustration only; other arrangements or configurations of CDU 201, CMU 202, and server blades 203 may also be implemented. Further, the front door disposed on frontend 204 and the back door disposed on backend 205 are optional. In some situations, there may no door on frontend 204 and/or backend 205.

In one embodiment, rack manifold and/or CDU (manifold/CDU) 201 may be a rack manifold or an integrated unit having a rack manifold and a rack CDU integrated therein. Rack manifold/CDU 201 may be configured to have the identical or similar form factor of server shelves 203. Typically, a CDU includes heat an exchanger, a liquid pump, and a pump controller. The heat exchanger may be a liquid-to-liquid heat exchanger. The primary loop of the CDU is coupled to an external CDU (e.g., room CDU) and/or a facility loop of a data center. The secondary loop of the rack CDU is coupled to the upstream ports of the rack manifold unit, where one or more downstream ports of the rack manifold are coupled to at least some of the server shelves 203, represented by liquid distribution loop 225. Liquid distribution loop 225 may be established using some flexible sectional pipes as described above.

With the flexible liquid cooling configuration using manifold/CDU unit 201, any of the server shelves 203 can hook up with manifold/CDU unit 201 to receive liquid cooling, as long as the cold plates are implemented in the server shelves. In this example, servers 203B-203C and 203E are liquid cooled by connecting with manifold/CDU 201, while server 203A and 203D are air cooled. There is no fixed or dedicated rack manifold implemented in the rack. With the rack manifold/CDU unit 201, a traditional air cooled electronic rack can be easily converted into a liquid cooled rack.

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 200 further includes RMU 202 configured to provide and manage power supplied to server blades 203 and manifold/CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.) to provide power to the rest of the components of electronic rack 200.

Figure 3A:
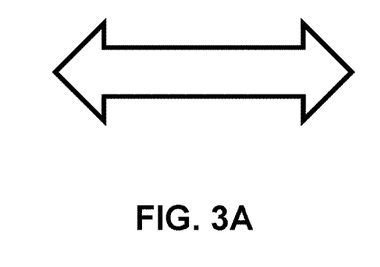
FIGS. 3A-3D show different configurations of sectional pipes according to certain embodiments
Figure 3B:
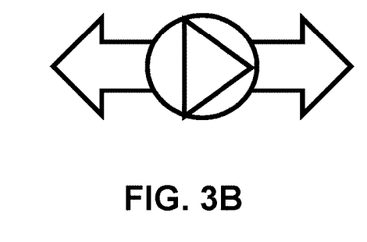
Figure 3C:
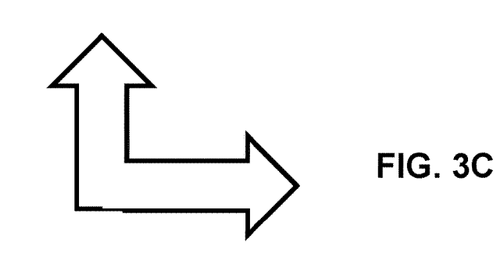
Figure 3D:
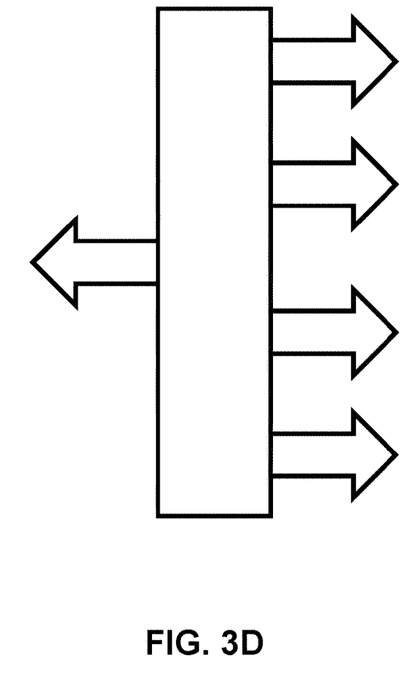

FIGS. 3A-3D show different configurations of prefabricated sectional pipes according to one embodiment. A sectional pipe can be a straight section pipe as shown in FIG. 3A, a pipe with a liquid pump as shown in FIG. 3B, an angled pipe as shown in FIG. 3C, or a one-to-N or N-to-one pipe as shown in FIG. 3D. In one embodiment, each sectional pipe includes a first end having a male dripless connector disposed thereon and a second end having a female dripless connector disposed thereon. Thus, a male connector of a first sectional pipe can easily be connected to a female connector of a second sectional pipe, or vice versa. As a result, a conventional air-cooled electronic rack can be easily converted to a liquid-cooled electronic rack. A typical sectional pipe may be approximately two feet long and the diameter of the sectional pipe may be subject to a liquid flow rate requirement of specific configurations. Note that these configurations are shown for illustration purpose only; other configurations may exist.

Figure 4:
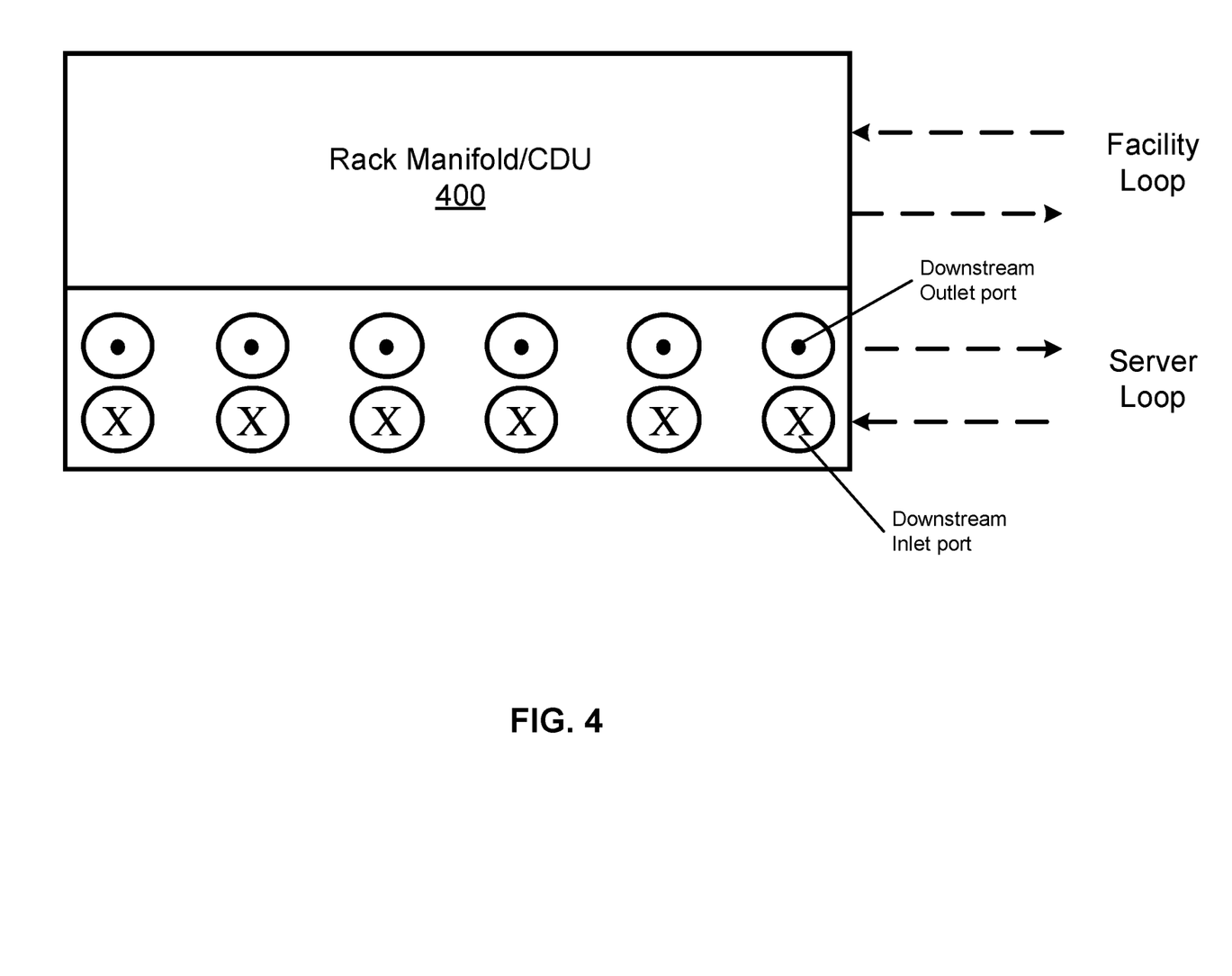
FIG. 4 shows an example of a rack manifold unit (optionally with a rack mounted CDU) according to one embodiment.

FIG. 4 shows an example of a rack manifold and rack CDU shelf according to one embodiment. Referring to FIG. 4, the integrated rack manifold unit 400 includes one or more pairs of downstream inlet and outlet ports to be coupled to the server shelves. An upstream pair of inlet and outlet ports may be coupled to a secondary loop of the CDU, while the primary loop of the CDU may be coupled to a room CDU or a cooling water loop. If the rack manifold and CDU are combined, the manifold upstream ports are interconnected with the CDU, and the upstream ports of the combined unit can be assembled on the CDU part and then may be coupled to a room cooling loop. Again, the CDU and the manifold can be manufactured as one single unit or two separate units. In this design, since the unit is designed to be populated onto an air cooling rack, it may require additional work to modify it to a liquid cooling rack. therefore, the rack CDU and rack manifold are designed using a same from factors as servers in terms of the width and depth. If the rack manifold unit and rack CDU are configured as separate units, each of the units may be configured as a form factor identical or similar to a standard shelf configuration. Thus, a rack manifold unit can be inserted into one standard shelf and a rack CDU can be inserted into another standard shelf of the electronic rack.

Figure 5:
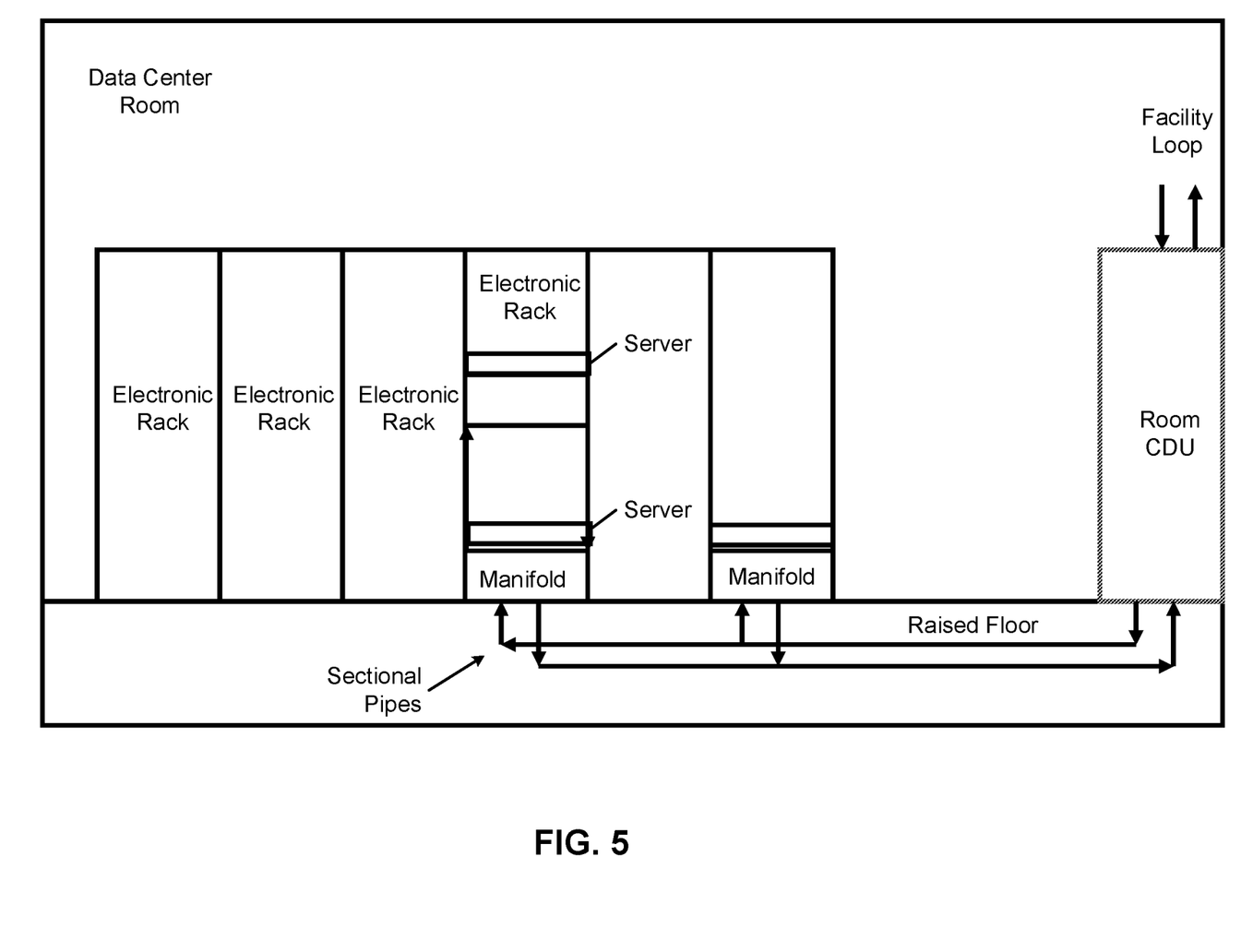
FIG. 5 shows an example of a data center room according to another embodiment.

FIG. 5 shows a data center room configuration according to one embodiment. Referring to FIG. 5, it can be seen that the floor mounted CDU is connected to the facility loop. The room CDU can be understood as replacing a CRAH/CRAC unit. This means the room CDU takes the floor space of a CRAH/CRAC unit and is connected to the facility loop that the CARH/CRAC unit was connected to. It can be seen that the sectional piping is assembled underneath the raised floor connecting the room CDU and the rack mounted manifolds. The rack mounted manifold is then connected to the liquid cooling servers. It is also shown in FIG. 5 that two or more rack mounted manifold units can be deployed in a single rack based on actual use cases. The fluid connection between two rack manifolds is needed. This design enables the retrofit an air-cooled data center quickly to a liquid cooling capable data center room.

Figure 6:
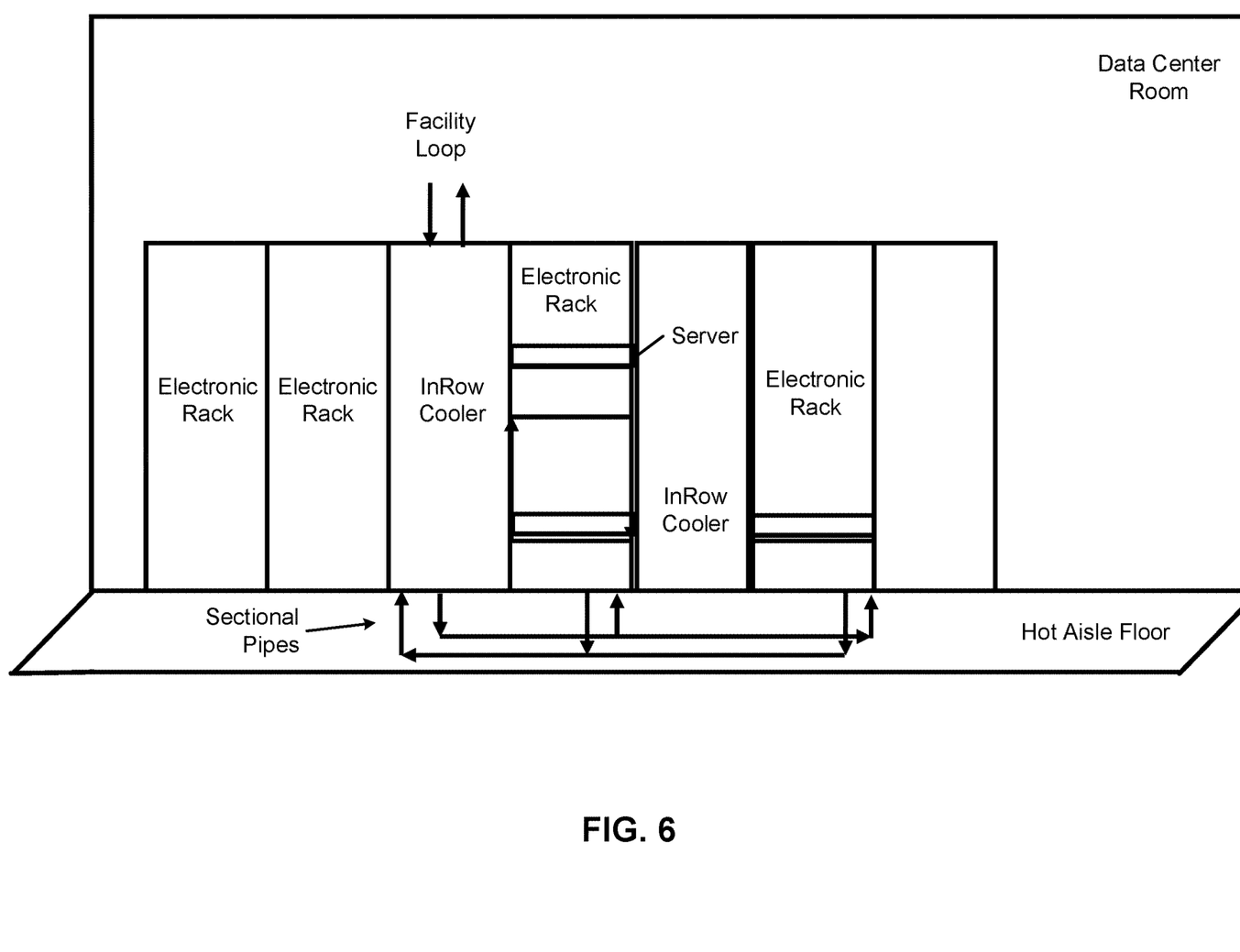
FIG. 6 shows an example of a data center room according to another embodiment.

FIG. 6 shows another deployment configuration where a room CDU replaces an InRow air cooling unit according to one embodiment. Note that the fluid piping is located on the hard floor of the hot aisle since the data center room may not be designed with a raised floor. The hot aisle floor shown in FIG. 6 is the floor within the hot aisle, and it is not a raised floor. The sectional pipes are located on the hard floor of the hot aisle. It can be seen that the method utilizes the existing facility loop which was designed for InRow cooler. With the sectional piping and rack mounted manifold and floor mounted CDU, the rack can be used for supporting liquid cooled server quickly.

Figure 7:
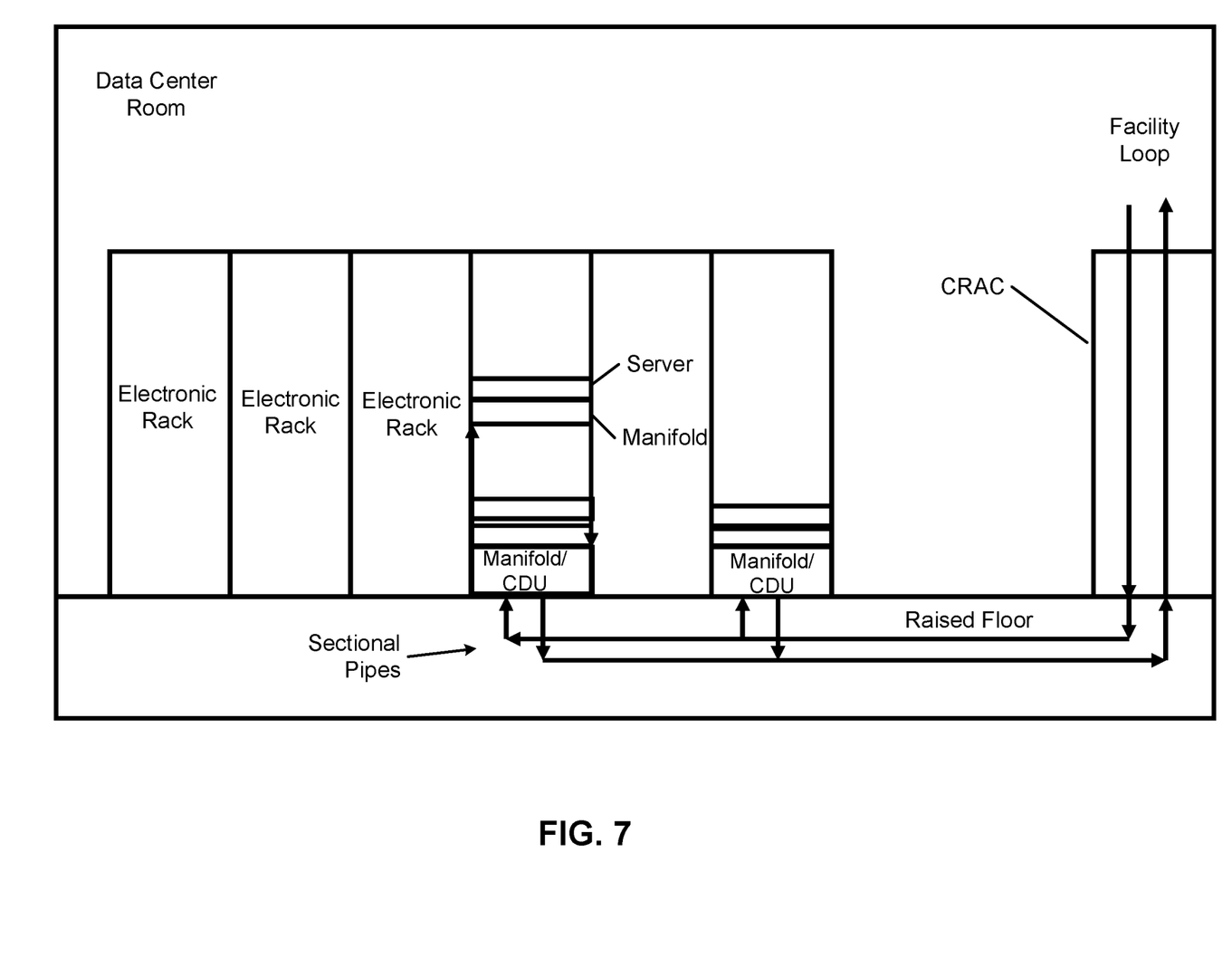
FIG. 7 shows an example of a data center room according to another embodiment.

FIG. 7 shows a deployment method using rack mounted CDU and manifold according to another embodiment. The facility loop which was used for a CRAC unit is also shared by the liquid cooling system. The sectional piping is used to connect with the facility loop. Then the CDU and sectional piping are connected to the facility loop. The rack mounted manifold can be either deployed together or separately as shown in FIG. 7.

Figure 8:
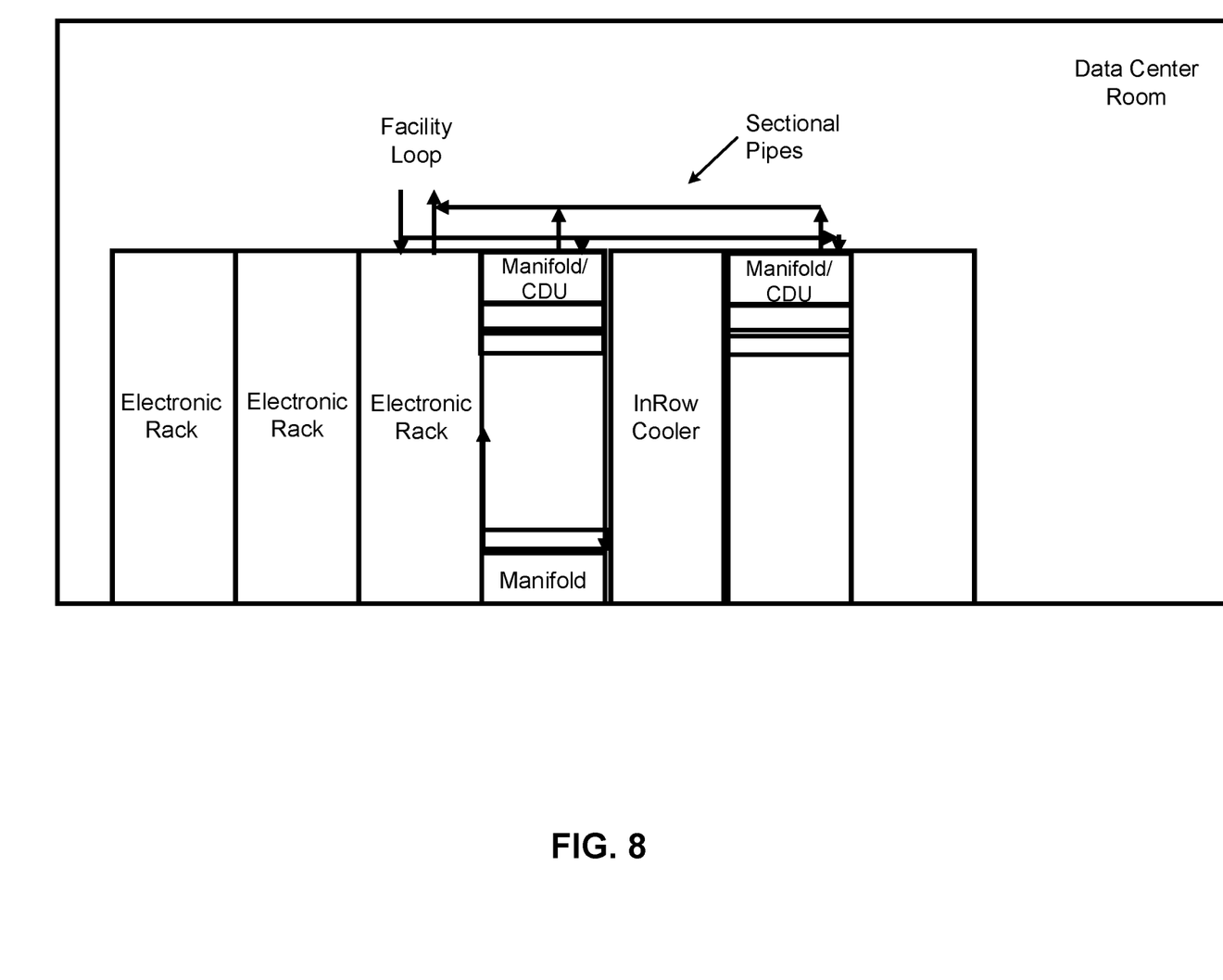
FIG. 8 shows an example of a data center room according to another embodiment.

FIG. 8 shows a similar deployment when the room is cooled using In-Row cooler according to another embodiment. The major difference between FIG. 7 and FIG. 8 is that the sectional piping can be used in different type of data center rooms, either a raised floor data center or a non-raised floor one. By using the sectional piping and rack mounted CDU and manifold, some of the electronic racks can be equipped with liquid cooling capability quickly using some of the techniques described through this application.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack of a data center, comprising:
   a plurality of server shelves inserted into at least some of a plurality of standard slots, each server shelf containing one or more servers and each server including one or more processors, wherein the one or more processors are mounted on one or more cold plates for liquid cooling; and
   a liquid manifold shelf inserted into one of the standard slots separate from the plurality of server shelves, the liquid manifold shelf comprising a form factor that is the same as the plurality of server shelves to fit into any of the plurality of standard slots, and wherein the liquid manifold shelf includes a pair of an upstream supply port and an upstream return port and further includes one or more pairs of a downstream inlet port and a downstream outlet port,
   wherein the upstream supply port is coupled to a facility liquid supply line to receive cooling liquid from an external cooling liquid source and the upstream return port to return the cooling liquid back to the external cooling liquid source, and
   wherein at least some of the pairs of the downstream inlet port and downstream outlet port are coupled to the one or more cold plates of one or more of the server shelves to circulate the cooling liquid—or a second cooling liquid to provide the liquid cooling to the to provide the liquid cooling to the corresponding one or more processors.

2. The electronic rack of claim 1, wherein the upstream supply port and the upstream return port are coupled to the external cooling liquid source via one or more sectional pipes that have been prefabricated.

3. The electronic rack of claim 2, wherein each of the one or more sectional pipes includes a first end having a male dripless blind mate connector and a second end having a female dripless blind mate connector.

4. The electronic rack of claim 2, wherein at least one of the one or more sectional pipes includes a liquid pump integrated therein.

5. The electronic rack of claim 2, wherein at least one of the one or more sectional pipes includes a 1-to-N distribution configuration.

6. The electronic rack of claim 2, wherein at least one of the one or more sectional pipes is in a curved or angled shape.

7. The electronic rack of claim 1, wherein the upstream supply port and the upstream return port are coupled to a room coolant distribution unit (CDU) located within a data center room that houses a plurality of electronic racks.

8. The electronic rack of claim 1, further comprising a rack coolant distribution unit (CDU), wherein the upstream inlet port and the upstream outlet port of the liquid manifold shelf are coupled to the rack CDU to form a secondary loop, and wherein the rack CDU is further coupled to the facility liquid supply line and a facility liquid return line of the data center to form a primary loop.

9. The electronic rack of claim 8, wherein the rack CDU is inserted into one of the standard shelves.

10. The electronic rack of claim 8, wherein the rack CDU and the liquid manifold shelf are integrated as a single unit that can be inserted into any one of the standard shelves.

11. The electronic rack of claim 8, wherein the electronic rack is disposed on a raised floor and the rack CDU is coupled to the facility liquid supply line and the facility liquid return line via a set of prefabricated sectional pipes that are disposed below the raised floor.

12. The electronic rack of claim 8, wherein the rack CDU is coupled to the facility liquid supply line and the facility liquid return line via a set of prefabricated sectional pipes that are above the electronic rack.

13. The electronic rack of claim 1, wherein the upstream supply port and the upstream return port of the liquid manifold shelf are coupled to a computer room air conditioning unit (CRAC) of the data center.

14. The electronic rack of claim 1, wherein the upstream supply port and the upstream return port of the liquid manifold shelf are coupled to an InRow air cooling unit of a data center room housing a plurality of electronic racks.

15. A data center, comprising:
    a plurality of electronic racks, wherein each of the electronic racks includes
       a plurality of server shelves inserted into at least some of a plurality of standard slots, each server shelf containing one or more servers and each server including one or more processors, wherein the one or more processors are mounted on one or more cold plates for liquid cooling; and
       a liquid manifold shelf inserted into one of the standard slots separate from the plurality of server shelves, the liquid manifold shelf comprising a form factor that is the same as the plurality of server shelves to fit into any of the plurality of standard slots, and wherein the liquid manifold shelf includes a pair of an upstream supply port and an upstream return port and further includes one or more pairs of a downstream inlet port and a downstream outlet port,
       wherein the upstream supply port is coupled to a facility liquid supply line to receive cooling liquid from an external cooling liquid source and the upstream return port to return the cooling liquid back to the external cooling liquid source, and wherein at least some of the pairs of the downstream inlet port and downstream outlet port are coupled to the one or more cold plates of one or more of the server shelves to circulate the cooling liquid to provide the liquid cooling to the corresponding one or more processors.

16. The data center of claim 15, wherein the upstream supply port and the upstream return port are coupled to the external cooling liquid source via one or more sectional pipes that have been prefabricated.

17. The data center of claim 16, wherein each of the one or more sectional pipes includes a first end having a male dripless blind mate connector and a second end having a female dripless blind mate connector.

18. The data center of claim 16, wherein at least one of the one or more sectional pipes includes a liquid pump integrated therein.

19. The data center of claim 16, wherein at least one of the one or more sectional pipes includes a 1-to-N distribution configuration.

20. The data center of claim 16, wherein at least one of the one or more sectional pipes is in a curved or angled shape.

\* \* \* \* \*